United States Patent [19]
Conley

[11] Patent Number: 4,822,288
[45] Date of Patent: Apr. 18, 1989

[54] PIN PANEL CIRCUIT BOARD ASSEMBLY

[76] Inventor: Larry Conley, 11146 Blue Allium, Fountain Valley, Calif. 92708

[21] Appl. No.: 96,680

[22] Filed: Sep. 14, 1987

[51] Int. Cl.[4] .............................................. H05K 1/00

[52] U.S. Cl. ...................................... 439/84; 439/221; 439/887; 439/434

[58] Field of Search ................. 439/55, 74, 75, 78-84, 439/741, 870, 887, 891, 908, 874, 876, 391-396, 400, 401, 407, 427, 433, 434, 221

[56] References Cited

U.S. PATENT DOCUMENTS

| | | | |
|---|---|---|---|
| 2,533,987 | 12/1950 | Bahr | 439/741 |
| 2,799,840 | 7/1957 | Barnes | 439/887 |
| 3,543,215 | 11/1970 | Jones | 439/82 |
| 3,821,692 | 6/1974 | Barnard | 439/887 |
| 3,854,114 | 12/1974 | Kloth et al. | 439/395 |
| 4,066,320 | 1/1978 | Goodrich et al. | 439/392 |
| 4,175,810 | 11/1979 | Holt et al. | 439/84 |
| 4,426,125 | 1/1984 | Crawford | 439/409 |

*Primary Examiner*—David Pirlot
*Attorney, Agent, or Firm*—Freilich, Hornbaker, Rosen & Fernandez

[57] ABSTRACT

A terminal system is described for use with circuit boards, which enables the terminals to be subsequently interconnected using any of a variety of point-to-point wiring methods. Each terminal includes a sleeve with a plated-through hole, the upper portion of the hole holding a contact clip member that receives leads of circuit components, and the lower portion of the hole formed to receive any of a variety of wire termination devices. A circuit board assembly is formed by first press-fitting the sleeves into holes in the board, from the component side of the board. A selected one of the many types of wire termination devices are later inserted into the bottom of the sleeve from the wiring side of the board. Each sleeve has a spline at its lower portion and a barb at its upper portion, which together resist rotation or withdrawal of the sleeve from its press-fitted position while avoiding warping of the board.

4 Claims, 3 Drawing Sheets

FIG. 1
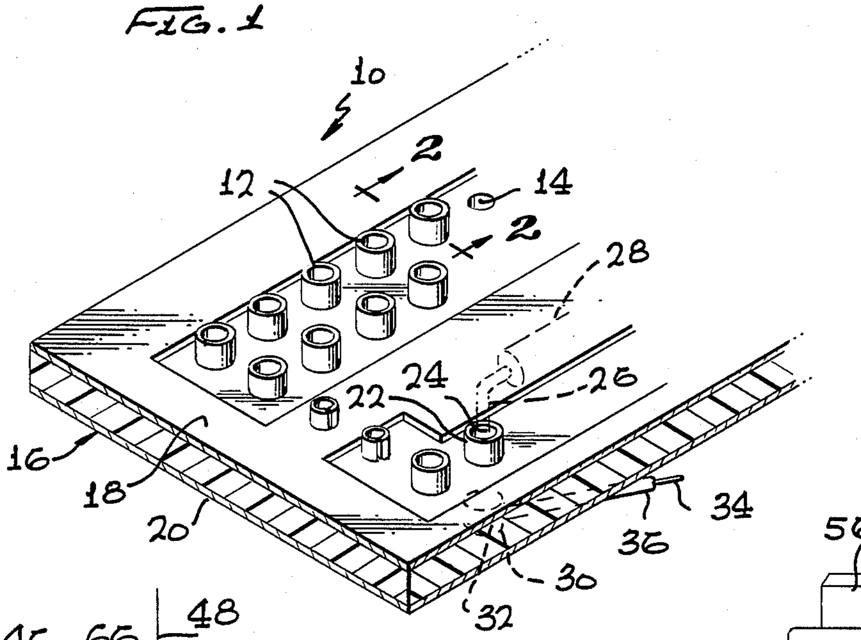
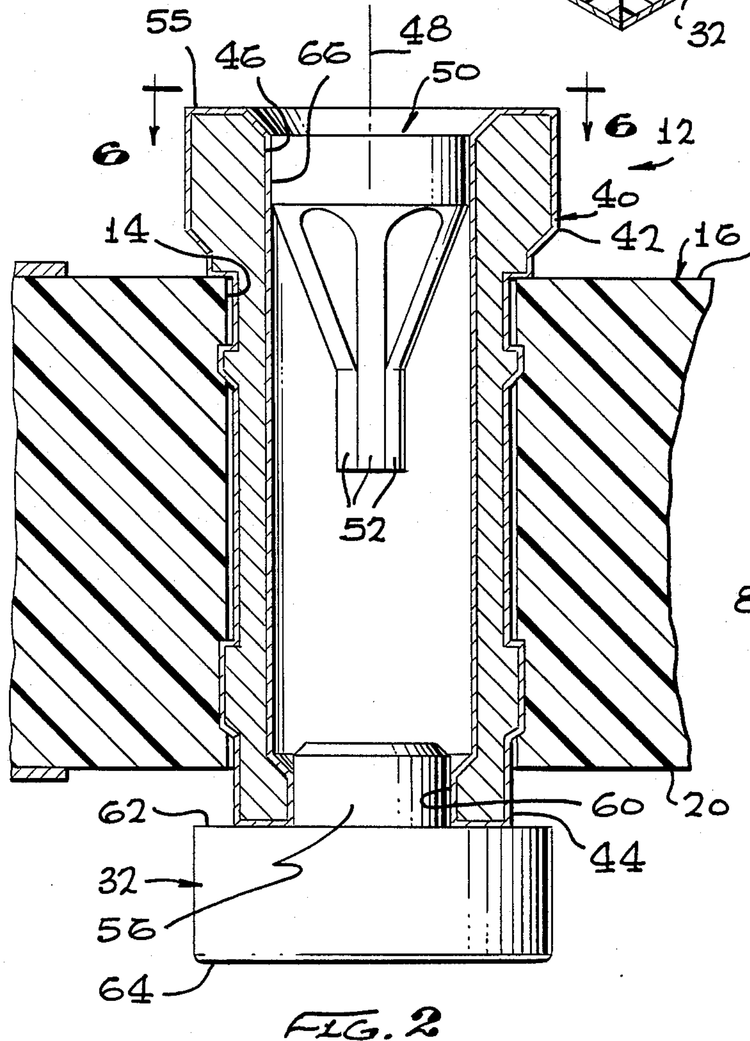
FIG. 2
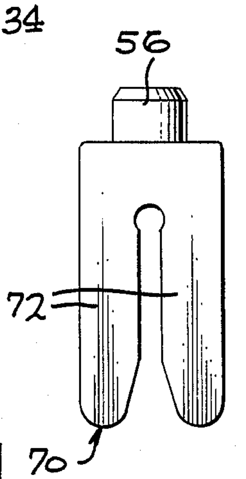
FIG. 3
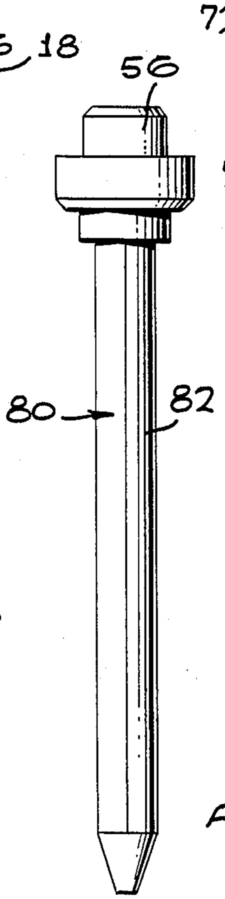
FIG. 4
FIG. 5
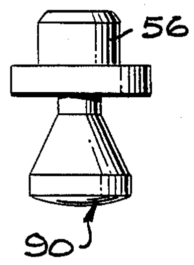

FIG. 6
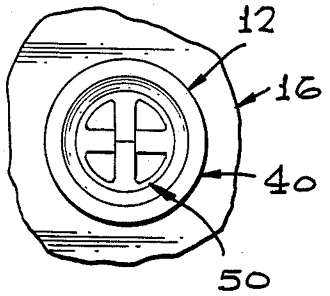
FIG. 7
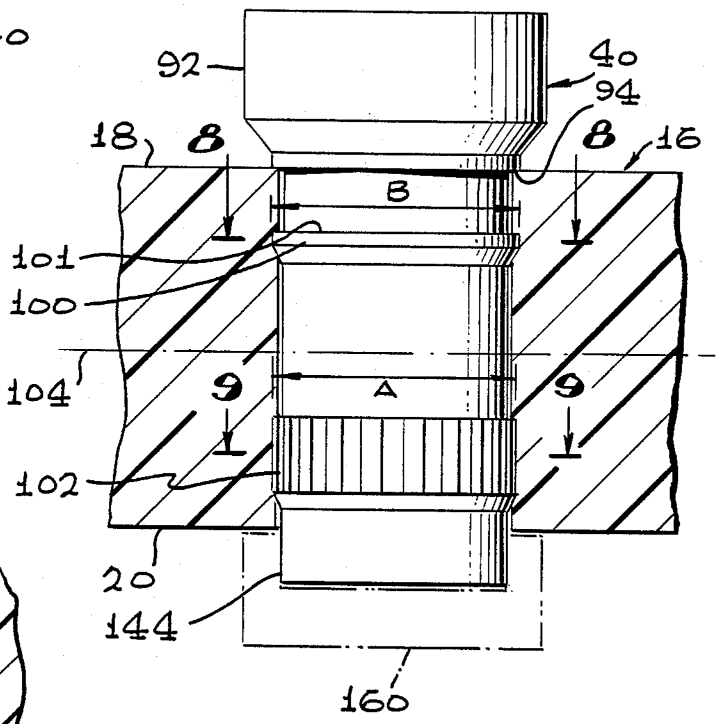
FIG. 8
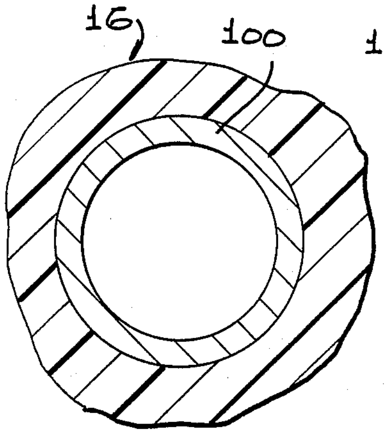
FIG. 9
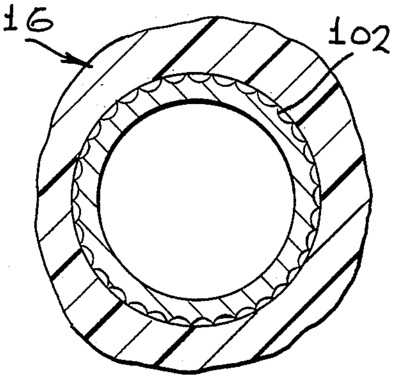
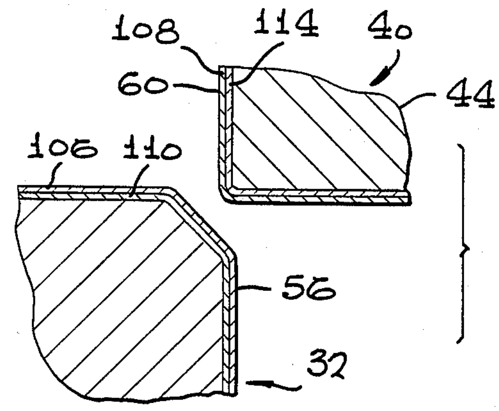
FIG. 10

PIN PANEL CIRCUIT BOARD ASSEMBLY

BACKGROUND OF THE INVENTION

A commonly used circuit board terminal is a socket connector pin that includes an upper portion in the form of a sleeve that holds a spring contact which clips to component leads as they are inserted, and a lower portion to which wires are terminated. Such pins are provided with a variety of wire terminations, including Stitch-wire terminations, Wire-wrap terminations (of three common tail lengths), and insulation displacement terminations. One type of wire termination is Solder-wrap, which commonly does not use a connector pin although greater reliability could be achieved if a machined pin were used.

The sleeve portions of prior socket pins have had blind holes which were electroplated to receive plated contact clips. Plating chemicals tend to become trapped at the bottom of the blind hole, which can lead to corrosion problems which are virtually undetectable immediately after assembly but which can later cause major reliability problems. Some manufactureres have drilled vent holes through the side of the sleeve portion to aid in rinsing of plating solutions, but the crossdrilling weakens the pin and adds to its cost. It would be desirable if a concentric through hole could be used instead of a blind hole, but the wire termination has been in the way.

Stitched bonding, used for high reliability applications, requires the wire termination (bonding surface) to be formed of stainless steel to facilitate diffusion bonding of nickel wires thereto. However, stainless steel alloys are extremely tough and slow to machine, and when type 303 series stainless steel is used for at least minimal machinability, sulfur and lead are added. These elements are disastrous for fusion welding and detrimental to diffusion bonding (stitch-bonding). The use of sulfur and lead causes a need for process adjustments which complicate in-process controls and increase costs. Another problem with stitch bonding terminations is that in circuit board designs with small holes, the diameter of the Stitch-wire surface which can pass through the hole is very small to accommodate printed circuit traces in between pins. As a result, the bonding of two wires to one small diameter pin is very difficult. It would be of considerable value if Stitch-wire socket pins were available which could be constructed at low cost with desirable stainless steel bonding surfaces and which could have large bond areas. It may be noted that "back loaded" stitch wire pins with large bond areas have been used that are installed from the bottom, or wiring side of the board; however, this has disadvantages including a very narrow entry for component leads and a narrow upper shoulder. These pins must also be mounted in 0.065" diameter or larger holes instead of the more common 0.055" diameter holes.

Insulation displacement socket pins have previously been designed for mounting in 0.065 inch diameter holes to enable the socket pin to be mounted from the wiring side of the circuit board. However, socket pins for other wiring processes have generally been mounted in 0.055 inch diameter holes, which cannot accept the insulation displacement pins. It would be desirable if the prior art style insulation displacement terminals were available which could mount in the smaller holes, allowing common circuit board designs to be utilized for any one of the wiring processes.

The tails of wire-wrapped pins are preferrably of cold-formed, spring tempered phospher bronze or beryllium cooper so they are rigid and of uniform shape and surface finish. However, the rest of the pin is most easily made on automatic screw machines (a type of lathe), where free machining brass is highly desirable. Prior art pins had tails machined of brass and then cross-milled to form a 0.025 inch square post, which resulted in inconsistant cross-sectional shapes and rough surface finishes. It would be desirable if the ideal material and forming processes were usable with each portion of the pin.

Circuit board pins are often formed with a barb or a straight spline to hold them in place. The barbs provide good retention, but tend to stress the circuit board unevenly to cause warping and may not be reliable in resisting turning during wire wrapping. The spline resists turning, but is not as good as a barb for retention in the board. A retention system which was highly effective and which minimized uneven stressing of the circuit board would be desirable.

A circuit board system which enabled almost complete assembly, with any of a variety of separate terminations readily added at a later time, would enable rapid supply of custom board assemblies.

SUMMARY OF THE INVENTION

In accordance with one embodiment of the present invention, a pin assembly is provided, which can be manufactured to provide highly desirable properties for a variety of wire termination types. The pin assembly includes an inexpensive sleeve which can be installed in a circuit board, and separate wire termination devices which can be installed in a hole at the end of the sleeve. The sleeve can be formed with a through hole extending from one end to the other, to assure good internal plating and coverage and good washout of plating chemicals without weakening the sleeve. The sleeve is formed of material desirable for its manufacture and mounting, while each separate style of termination device can be formed of a material and by a method which optimizes its wire termination capability.

The sleeve can include a spline portion near the bottom which lies near the lower surface of a circuit board, and a barb near the top that lies near the top of the circuit board, to separate the anti-rotation function from the retention function, and to more evenly stress the circuit board.

The circuit board can be constructed by installing identical sleeves in holes in the board, by inserting the sleeves from the upper face of the board. The board can be stored until a customer decides what terminations are wanted. Then the appropriate terminations are installed from the bottom side of the board, by inserting shafts on the terminations into the lower ends of the holes in the sleeves.

The novel features of the invention are set forth with particularity in the appended claims. The invention will be best understood from the following description when read in conjunction with the accompanying drawings.

BRIEF DESCRIPTION OF THE DRAWINGS

FIG. 1 is a sectional perspective view of a pin panel circuit board assembly constructed in accordance with the present invention.

FIG. 2 is a view taken on the line 2—2, showing a socket pin assembly with a stitch-bond termination device in place thereon.

FIG. 3 is a side elevation view of an insulation displacement termination device alternately useful in the pin assembly of FIG. 2.

FIG. 4 is a side elevation view of a wire wrap termination device alternately useful in the pin assembly of FIG. 2.

FIG. 5 is a side elevation view of a solder-wrap terminal device alternately useful in the pin assembly of FIG. 2.

FIG. 6 is a view taken on the line 6—6 of FIG. 2.

FIG. 7 is a side elevation view of the sleeve of the pin assembly of FIG. 2.

FIG. 8 is a view taken on the line 8—8 of FIG. 7.

FIG. 9 is a view taken on the line 9—9 of FIG. 7.

FIG. 10 is a partial sectional view of a termination device and sleeve constructed in accordance with another embodiment of the invention.

DESCRIPTION OF THE PREFERRED EMBODIMENTS

Figure 11:
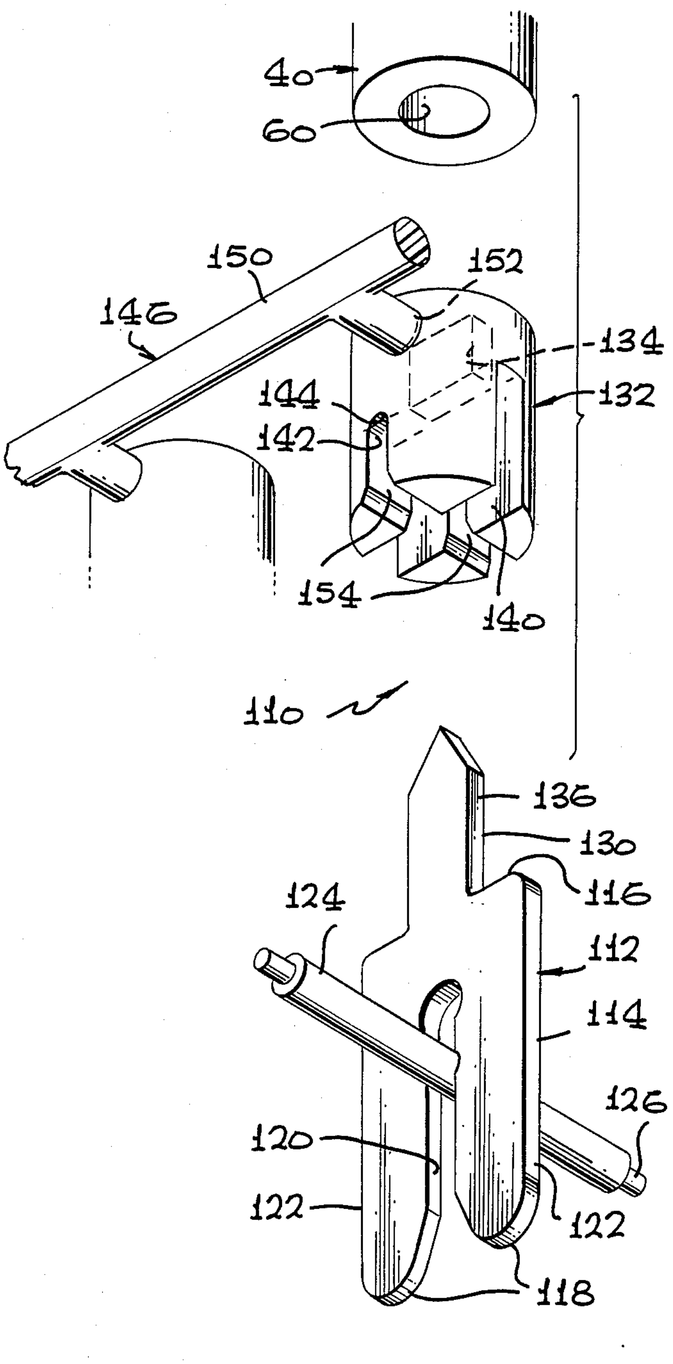
FIG. 11 is an exploded bottom perspective view of an insulation-displacement termination device in accordance with the invention.

FIG. 1 illustrates a circuit board assembly 10 of a type often referred to as a socket pin panel, which includes numerous socket pins or pin assemblies 12 that lie in holes 14 of a circuit board 16. The circuit board may be considered to have upper and lower faces 18, 20 for ease in description, although this does not designate their orientation in actual use. The faces are often referred to as the component face 18 and the wiring face 20. Each pin assembly has an inner or upper end 22 with a hole 24 that is designed to receive a lead 26 of a circuit component 28 such as an integrated circuit, resistor, capacitor, etc. Each pin assembly also has an outer or lower end 30 forming a wire termination device 32 to which wires are connected. The conductor 34 of an insulated wire 36 can be connected to the socket pin assembly, to enable interconnection of selected pin assemblies and the corresponding component leads received in them.

As shown in FIG. 2, each pin assembly includes a main shaft or sleeve 40 having upper and lower ends 42, 44 and having a plated through hole 46 extending along a pin axis 48 between its ends and a plating 66 on all surfaces. A spring clip 50 lies in the plated hole and has a plurality of fingers 52 which can engage the lead of a circuit component to mechanically hold the component and electrically connect to it. The particular wire termination device is a stitch-bond termination device to which the conductors of wires are diffusion-bonded. The stitch-wire termination device 32 includes an upper end 56 forming a rod or mounting shaft that makes a gas-tight press fit with a bottom or outer end portion 60 of the hole in the sleeve, the bottom portion 60 forming a shaft-receiving hole. The termination device includes an upper shoulder 62 that abuts the extreme lower end of the sleeve, and includes a lower or outer surface forming a wire engaging area 64 that holds and electrically connects, via bonding, to a wire conductor.

The main shaft or sleeve 40 can be made out of an easily machinable material such as brass, with its surfaces electroplated to form plating 66 to make good electrical contact with the clip and to prevent corrosion and provide solderability. The through hole 46 can be thoroughly washed out after plating to avoid trapped plating bath chemicals which could promote corrosion and otherwise cause major reliability problems, which are likely to show up only after the circuit board is put into use. The sleeve is substantially devoid of holes in its side walls, which were used in the past to help wash out plating chemicals and which weakened the pin and increased cost.

The weld termination device 32 is of relatively simple shape, without thin walls or complex contours that would be difficult to machine or cold-form when constructed of stainless steel. In fact, the simplicity makes it possible to economically form the weld termination device 32 of a stainless steel composition such as type 384, which does not have lead or sulfur, to which wires can be reliably diffusion bonded or welded to, even though it is also harder to machine. Because of the fact that the weld termination device 32 is installed from the bottom surface 20 of the circuit board, it does not have to pass through the circuit board hole. As a result, the bonding surface 64 can have a greater diameter than the hole 14 in the circuit board in which the pin assembly is installed. This enables a bond or weld termination device 32 to be used which has a large enough bonding surface 64 to permit multiple connections wherein two or more conductors are stitch-wired to the same socket pin assembly. Also, the upper surface 55 of the sleeve can have a wide lip around the hole 46 to assure good contact with an electrode used in stitch-bonding a wire to the pin assembly. The fact that the complex sleeve assembly is made from easy to machine brass, while the simple Stitch-wire termination device is economically constructed of stainless steel, means that the Stitch-wire interconnection method welding can be used in many situations where it has heretofore been too expensive.

FIG. 3 illustrates another termination device in the form of an insulation displacement termination device 70. The termination device 70 has a shaft or rod 56 that is press fitted into the sleeve and has a pair of tines 72 forming a slot through which insulated wire is passed to make contact with the conductor of the wire. While the diameter of the hole 14 in the circuit board may be of a commonly used diameter of 0.055 inch to accept the sleeve 40, the width of the termination device 70 can be larger to provide the required strength. Also, the termination 70 device can be constructed by the most appropriate technology therefor, as by stamping it from flat metal, while the sleeve is formed by a different process such as machining to provide a pin assembly of high overall machanical and electrical performance and which can be installed from the top, or component side, of the circuit board.

FIG. 4 shows a wire wrap termination device 80, which includes a mounting shaft 56 that is press fit into the sleeve and a tail 82 around which wire is wrapped. The tails work best when they are straight and "springy," and the preferred way to form them is to coin or cold-form them from wire to provide a uniform cross-section and good surface finish. Where a one-piece pin was used in the prior art, it was formed of brass which was machined to form the sleeve portion and which was then sawed or milled to form the tail portion. By separately forming the tail, it can be formed of spring tempered phospher bronze or beryllium cooper by cold forming.

FIG. 4 shows a solder wrap termination device 90 which also has a mounting shaft 56 that can be press fit into the sleeve. Present solder-wrap termination techniques do not use individually machined socket pins into which component leads are plugged. Instead, the component leads are allowed to protrude through the circuit board, and wire connections are made to such protruding leads. The solder wrap termination device 90 which can be mounted on a machined sleeve, enables the simple and cost effective solder-wrap technique to be used and allows the components to be reliably plugged into the sleeve assembly.

FIG. 7 illustrates the outside of the sleeve 40, showing it installed in a circuit board 16. The sleeve has a head 92 at its upper end, with a head shoulder 94 that abuts the upper surface 18 of the board. The sleeve has a barb 100 with an upwardly facing surface 101 which offers high resistance to push out, but which can allow the pin assembly to rotate and/or wobble in the mounting hole 14, especially if the diameter of the hole 14 is near the maximum allowed within tolerances. Wobble and rotation of the sleeve is avoided by inclusion of a spline at 102 which has multiple protrusions spaced abuout its periphery. The diameter A of the spline is preferrably slightly less than the diameter B of the barb, and the spline 102 lies closer to the lower or outer end 44 of the sleeve than the barb. For example, the barb diameter may be specified as 0.059 to 0.061 inch, while the major spline diameter may be specified as 0.058 to 0.059 inch, to assure that the hole left after the spline passes down, is everywhere smaller than the barb. When the sleeve is press fitted into the board hole 14 from the upper surface 18, the spline 102 only moderately scrapes the hole 14 along most of its length, while the barb 100 applies a more complete fit to the hole around its entire circumference. Although there is stress induced in the circuit board during pin installation, especially with close spacing of holes, the fact that the stress occurs at both the top and bottom greatly reduces warping and the possiblity of delamination, cracking, and "measling" of a fiberglass board material. The position of the barb and spline are positioned to balance any board stress, preferably located toward the outer surfaces of the board on opposite sides on an imaginary plane 104 halfway between the upper and lower board surfaces 18, 20).

FIG. 10 shows part of a sleeve lower hole portion 60 and part of a termination mounting shaft 56. For very high reliability applications, applicant prefers to plate both the shaft 56 and the sleeve portion 60 with a layer 106, 108 of Indium. A nickel barrier layer 110, 114 lies between the base metal of each part and the Indium layer. Indium is a ductile metal which has the unique property of adhering to itself by "cold welding" when the two parts are pressed together under relatively low compression force. The press fit of the termination device 32 to the sleeve 40 results in the termination device becoming electrically and metallurgically part of the sleeve.

Insulation displacement termination devices, such as the type shown in FIG. 3, can allow the insulated wire to be pushed down too far between the tines 72, which can result in severing the wire. To control depth of insertion in such termination devices, they have been formed with an additional metal piece folded through the wire slot to form a positive stop for the wiring tool. However, the tooling required to form and deflect the stop to its final position was very expensive.

Figure 12:
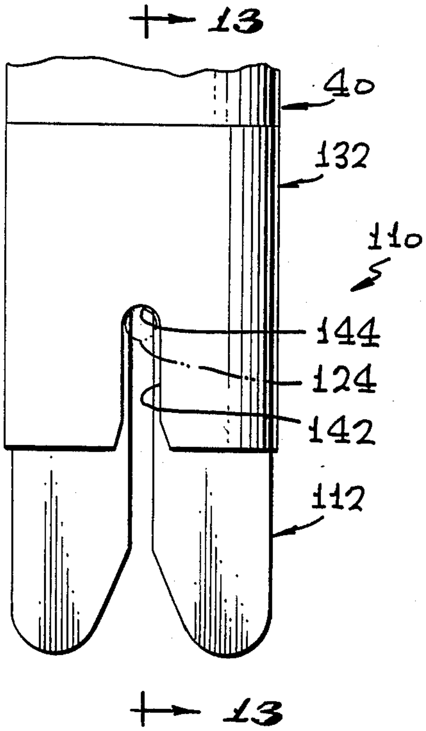
FIG. 12 is a side elevation view of the device of FIG. 11 in an assembled configuration.
Figure 13:
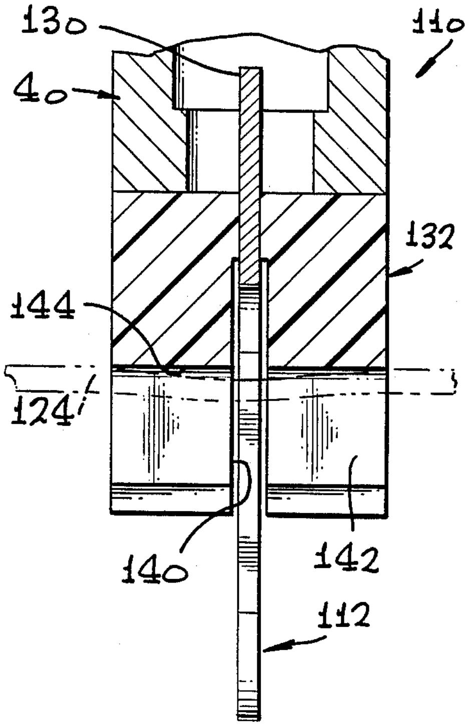
FIG. 13 is a view taken on the line 13—13 of FIG. 12.

FIGS. 11–13 illustrate another insulation displacement termination device 110 which can be received in the outer hole end portion 60 of the sleeve 40. The device includes a stamped electrically conductive insulation displacement part 112 of a metal such as beryllium cooper, which includes a plate-like portion 114 having inner and outer ends 116, 118. The plate-like portion has an insulation-displacing slot 120 extending into its outer end, to form a pair of tines 122 on opposite sides of the slot. The slot 120 can receive an insulated wire 124 to displace the insulation and make gas-tight contact with the wire conductor 126. The part also includes a mounting shaft or mount 130 extending inwardly from the inner end of the plate portion.

The insulation displacement device also includes a plastic stop part 132 with a hole 134 through which the mount 130 of the metal part can pass, so that the inner end 136 of the mount can make a press fit with the hole portion 60 in the sleeve 40. The stop part 132 includes an orienting slot 140 for receiving the tines of the plate-like portion 114 of the part 112, and includes a guide slot 142 for receiving the wire. The guide slot 142 has a bottom which forms a stop 144 that limits the depth of insertion of the insulated wire between the tines of the metal part. FIGS. 12 and 13 show the insulated wire 124 in its final installed position in a termination device.

The stop part 132 can be formed as part of a plastic molded strip 146 having numerous plastic stop parts 132 molded integrally with a carrier 150 and spaced at a distance such as 0.1 inch which equals the spacing of the pin assemblies in the circuit board. An insulation-displacement part 112 can be previously installed in each of the stop parts 132. The strip 146 can be held with all of the termination devices 110 positioned over corresponding sleeves in the circuit board, and then rapidly installed in the sleeves. During such installation, the carrier 150 of the strip 140 can be sheared at 152 to separate each plastic stop part from the carrier.

This arrangement for installing insulation displacement termination devices enables the metal and plastic parts 112 and 130 to each be formed with relatively low cost tooling and in simple steps, while also facilitating the mounting of numerous termination devices in corresponding sleeves that have been installed in a circuit board. This arrangement also results in greater reliability of wire-to-termination device contact, because the guide slot side walls 154 provide lateral support for the insulating wire to resist wire flexing during handling. Avoiding wire flexing avoids loss of a gas-tight electrical-mechanical connection between the tines on the termination device and the wire conductor.

The use of sleeves with separately installed wire terminations, facilitates the transition between a very commonly used one-piece wire-wrap pin termination which is of low cost, to other emerging low-profile wiring techniques including Stitch-wire, insulation displacement, and solder wrap, which are currently more expensive because they are produced in smaller quantities. The use of sockets which can accept any termination facilitates the transition to the emerging wiring techniques which operate at higher circuit switching speeds, higher packaging densities, and, in some cases, higher reliability. Universal circuit boards can be fabricated and universal socket pins or sleeves installed, the assembly stress relieved, decoupling capacitors added and the circuit board tested, and the assembly with preassembled force fit pins then placed in inventory for subsequent addition of termination devices. Only when a customer specifies the desired termination devices are they installed. Prior art logic panel designs do no permit assembly prior to sale without the manufacturer incurring very large inventory costs, because of the wide variety of termination types and wiring methods that customers might choose. By enabling circuit boards to be ready for shipment only upon installation of the termination devices, extremely fast delivery of logic panels is possible.

Thus, the invention provides a terminal pin circuit board assembly, especially one with socket pins, which enables pins of high reliability to be manufactured that can be interconnected using a wide variety of wiring technologies. Each pin or pin assembly includes a main shaft or sleeve that can be securely installed in a hole in a circuit board, the sleeve having a hole at its bottom end which can receive a shaft or a wiring termination device after the sleeve is installed in the circuit board. (It is also possible for the termination device to be provided with a hole to receive the bottom of the sleeve or shaft, as indicated at 160 in FIG. 7). The sleeve can be formed with a plated through hole, which minimizes retention of plating chemicals. The sleeve can be formed with barb and spline retention portions to avoid push out and rotation of the sleeve, with minimum stressing of the circuit board. The portions of the wire termination device and sleeve which are press fitted together may be plated with indium, to form a cold weld between the parts. An insulation displacement termination device can be formed of a plastic stop part that limits wire insertion depth in an insulation-displacement part of the device.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A pin system for installation in a circuit board that has upper and lower opposite surfaces and a plurality of board holes, comprising:

a main shaft having upper and lower ends, said shaft formed so its lower end can pass through said upper board surface and substantially through one of said board holes so said shaft lies in said board hole, said shaft being rigid and including an exterior surface for preassembled force fit in said board hole, and said shaft having a hole in its lower end;

a plurality of wire termination devices each having an upper end that can fit into and anchor itself in said hole in said lower end of said shaft, each termination device also having a lower end forming a means for holding onto and making electrical connection with a wire conductor.

2. The system described in claim 1 wherein:

said main shaft is formed of an easily machined material, and said hole in said main shaft extends through its entire height, and including a spring clip fixed in said shaft hole;

a first of said termination devices is formed of a material that is harder to machine than the material of said main shaft, said termination device including a mounting shaft lying in interference fit in said main shaft hole, and said termination device having an upper shoulder abutting said lower end of said main shaft.

3. The system described in claim 1 wherein:

said plurality of termination devices includes a first plurality of wire wrap termination devices each of whose lower end has an elongated tail about which a wire can be wrapped, and a second plurality of stitch wire termination devices each of whose lower end forms a substantially flat surface to which a wire can be bonded.

4. The system described in claim 1 wherein:

said shaft has a barb lying closer to its upper end than its lower end and a spline located closer to its lower end than its upper end.

* * * * *